United States Patent
Zang et al.

(10) Patent No.: US 10,147,802 B2
(45) Date of Patent: Dec. 4, 2018

(54) FINFET CIRCUIT STRUCTURES WITH VERTICALLY SPACED TRANSISTORS AND FABRICATION METHODS

(71) Applicant: GLOBALFOUNDRIES Inc., Grand Cayman (KY)

(72) Inventors: Hui Zang, Guilderland, NY (US); Manfred Eller, Beacon, NY (US); Min-hwa Chi, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/160,591

(22) Filed: May 20, 2016

(65) Prior Publication Data
US 2017/0338235 A1    Nov. 23, 2017

(51) Int. Cl.
*H01L 29/66* (2006.01)
*H01L 29/06* (2006.01)
(Continued)

(52) U.S. Cl.
CPC .... *H01L 29/66795* (2013.01); *H01L 27/1104* (2013.01); *H01L 27/1211* (2013.01);
(Continued)

(58) Field of Classification Search
CPC ........... H01L 27/1108; H01L 29/66795; H01L 29/7856; H01L 29/0649; H01L 21/823431;
(Continued)

(56) References Cited

U.S. PATENT DOCUMENTS 9,093,550 B1 * 7/2015 Zhao ................. H01L 21/82
9,484,263 B1 * 11/2016 Lin ................ H01L 21/823437
(Continued)

OTHER PUBLICATIONS

S. Monfrey, et.al. "Localized SOI technology: an innovative Low Cost self-aligned process for Ultra Thin Si-film on thin BOX integration for Low Power applications", IEDM, p. 693, 2007.
(Continued)

*Primary Examiner* — Bitew A Dinke
(74) *Attorney, Agent, or Firm* — Heslin Rothenberg Farley & Mesiti P.C.; Nathan B. Davis

(57) ABSTRACT

Circuit structures, such as inverters and static random access memories, and fabrication methods thereof are presented. The circuit structures include, for instance: a first transistor, the first transistor having a first channel region disposed above an isolation region; and a second transistor, the second transistor having a second channel region, the second channel region being laterally adjacent to the first channel region of the first transistor and vertically spaced apart therefrom by the isolation region thereof. In one embodiment, the first channel region and the isolation region of the first transistor are disposed above a substrate, and the substrate includes the second channel region of the second transistor. In another embodiment, the first transistor includes a fin structure extending from the substrate, and an upper portion of the fin structure includes the first channel region and a lower portion of the fin structure includes the isolation region.

7 Claims, 8 Drawing Sheets

(51) Int. Cl.
   *H01L 29/78* (2006.01)
   *H01L 27/11* (2006.01)
   *H01L 27/12* (2006.01)
   *H01L 27/02* (2006.01)
(52) U.S. Cl.
   CPC ...... *H01L 29/0649* (2013.01); *H01L 29/7856* (2013.01); *H01L 27/0207* (2013.01)
(58) Field of Classification Search
   CPC ........... H01L 21/823821; H01L 21/845; H01L 27/0886; H01L 27/0924; H01L 27/10826
   See application file for complete search history.

(56) References Cited

U.S. PATENT DOCUMENTS

| | | | | |
|---|---|---|---|---|
| 2005/0082531 | A1* | 4/2005 | Rim | H01L 21/84 257/72 |
| 2006/0084212 | A1* | 4/2006 | Anderson | H01L 21/823821 438/197 |
| 2007/0108528 | A1* | 5/2007 | Anderson | H01L 27/11 257/365 |
| 2008/0227241 | A1* | 9/2008 | Nakabayashi | H01L 21/845 438/150 |
| 2008/0308848 | A1* | 12/2008 | Inaba | G11C 11/412 257/255 |
| 2009/0072276 | A1* | 3/2009 | Inaba | H01L 21/823807 257/255 |
| 2009/0159972 | A1* | 6/2009 | Jakschik | H01L 21/84 257/350 |
| 2009/0218632 | A1* | 9/2009 | Cheng | H01L 21/823807 257/369 |
| 2011/0175152 | A1* | 7/2011 | Booth, Jr. | H01L 21/845 257/306 |
| 2012/0104509 | A1* | 5/2012 | Matsumoto | H01L 21/823814 257/369 |
| 2012/0181591 | A1* | 7/2012 | Chen | H01L 27/11519 257/314 |
| 2013/0087855 | A1* | 4/2013 | Makiyama | H01L 21/84 257/350 |
| 2013/0175618 | A1* | 7/2013 | Cheng | H01L 21/823431 257/347 |
| 2013/0299918 | A1* | 11/2013 | Kim | H01L 29/78 257/402 |
| 2014/0332861 | A1* | 11/2014 | Cheng | H01L 29/66795 257/288 |
| 2015/0214340 | A1* | 7/2015 | Maeda | H01L 29/66818 438/283 |
| 2015/0228647 | A1* | 8/2015 | Chang | H01L 21/823431 257/401 |
| 2015/0325572 | A1* | 11/2015 | Cheng | H01L 21/762 257/369 |
| 2015/0357331 | A1* | 12/2015 | Cheng | H01L 21/762 257/369 |
| 2016/0005852 | A1* | 1/2016 | Kim | H01L 29/785 257/401 |
| 2016/0111320 | A1* | 4/2016 | Shen | H01L 21/76232 257/401 |
| 2016/0133703 | A1* | 5/2016 | Chang | H01L 21/823412 257/349 |
| 2016/0190271 | A1* | 6/2016 | You | H01L 29/42376 257/401 |
| 2016/0225789 | A1* | 8/2016 | Doris | H01L 29/785 |
| 2016/0284607 | A1* | 9/2016 | Cai | H01L 21/845 |
| 2017/0005165 | A1* | 1/2017 | Chen | H01L 29/785 |

OTHER PUBLICATIONS

Q. Liu, et.al. "Ultra-Thin-Body and BOX (UTBB) Fully Depleted (FD) Device Integration for 22nm Node and Beyond", VLSI Technology, p. 62, 2010.

U.S. Appl. No. 15/160,623, filed May 20, 2016, titled Circuit Structures With Vertically Spaced Transistors and Fabrication Methods.

* cited by examiner

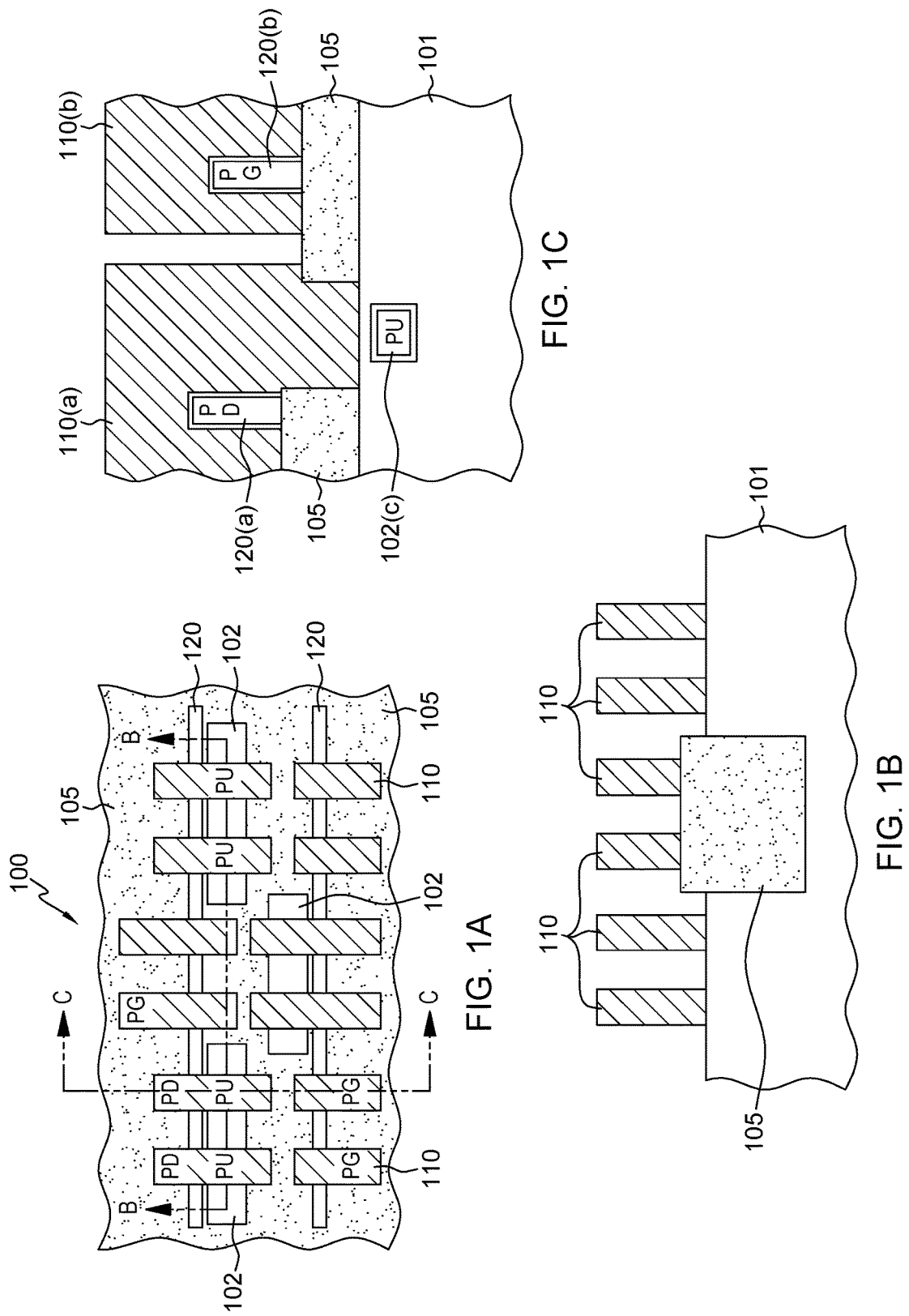

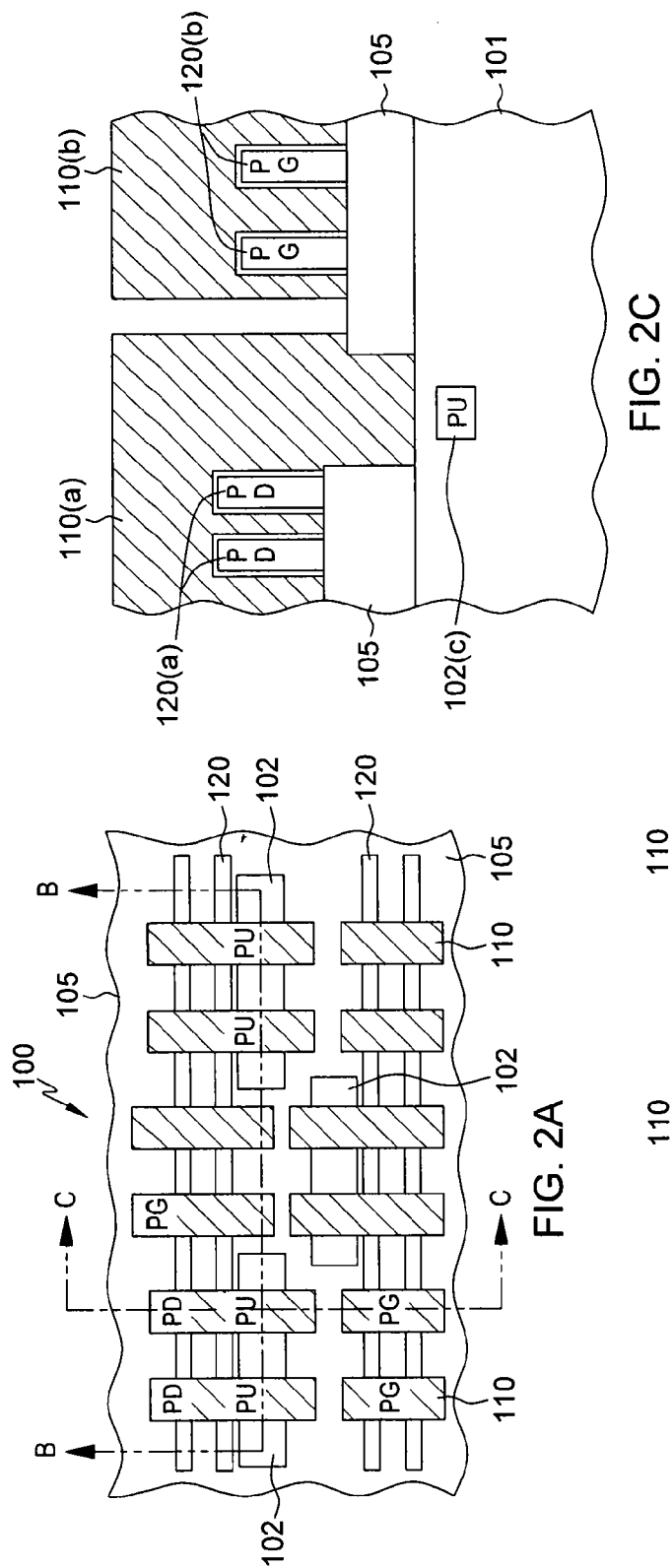

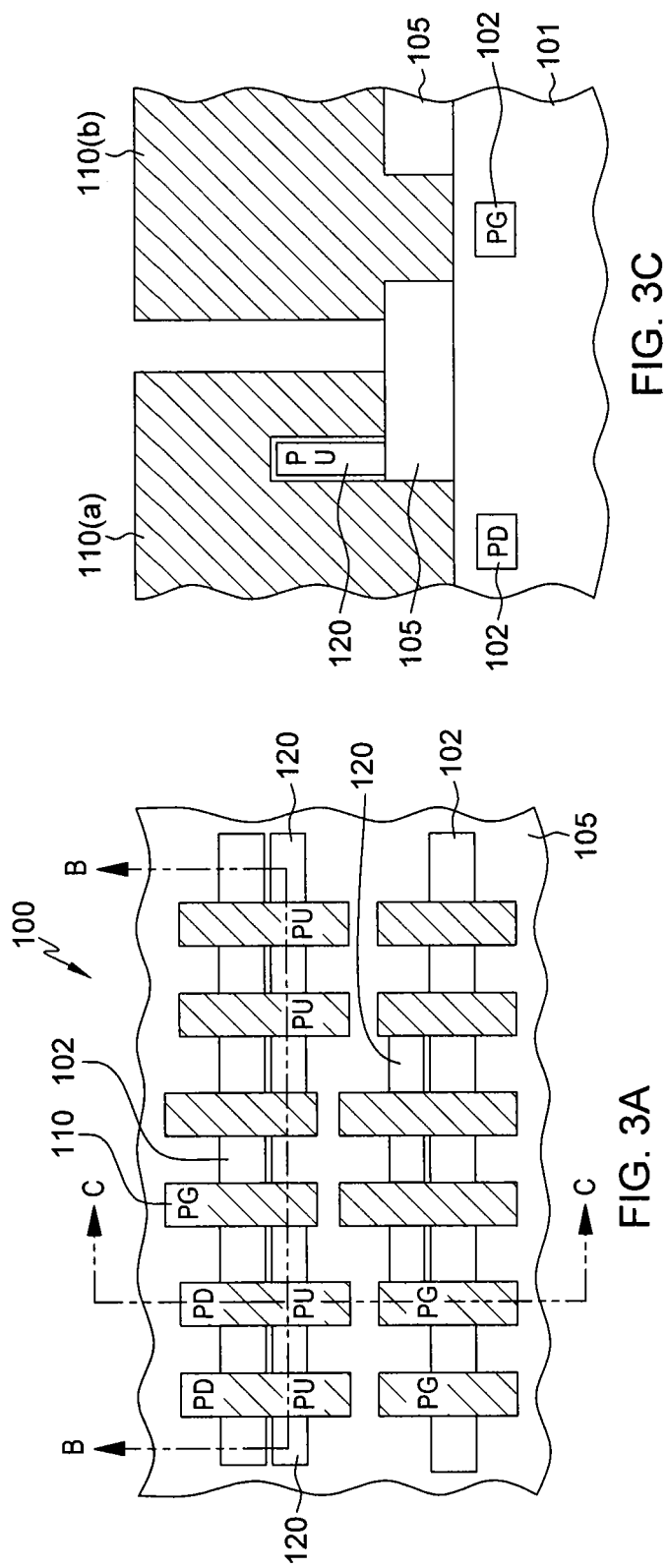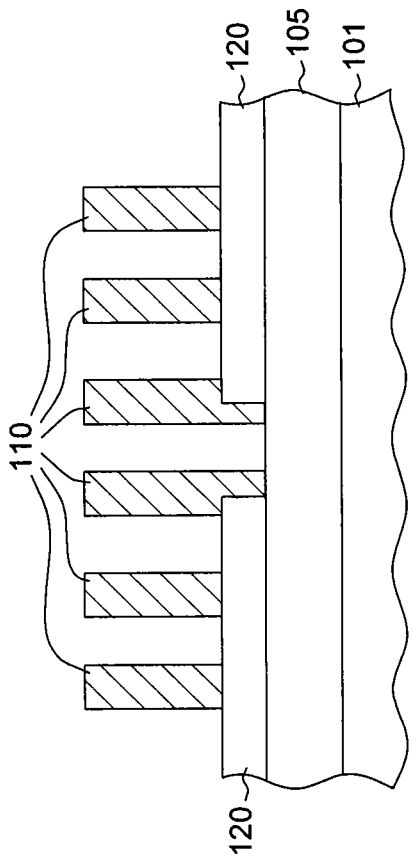

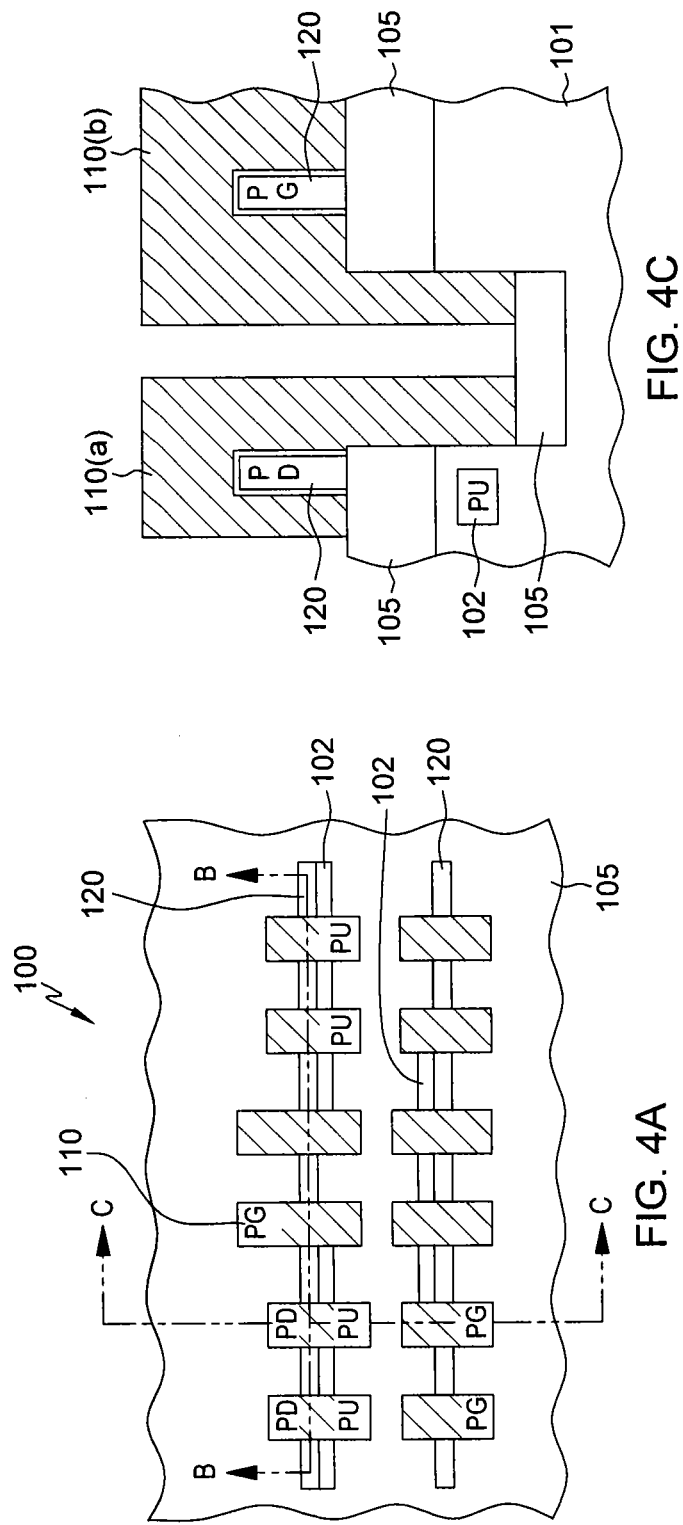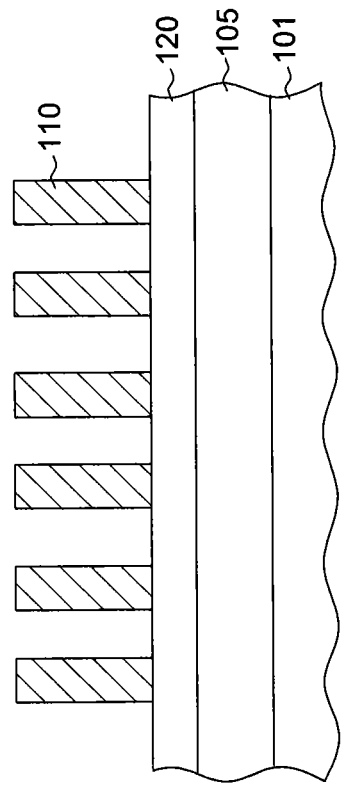
FIG. 4A
FIG. 4B
FIG. 4C

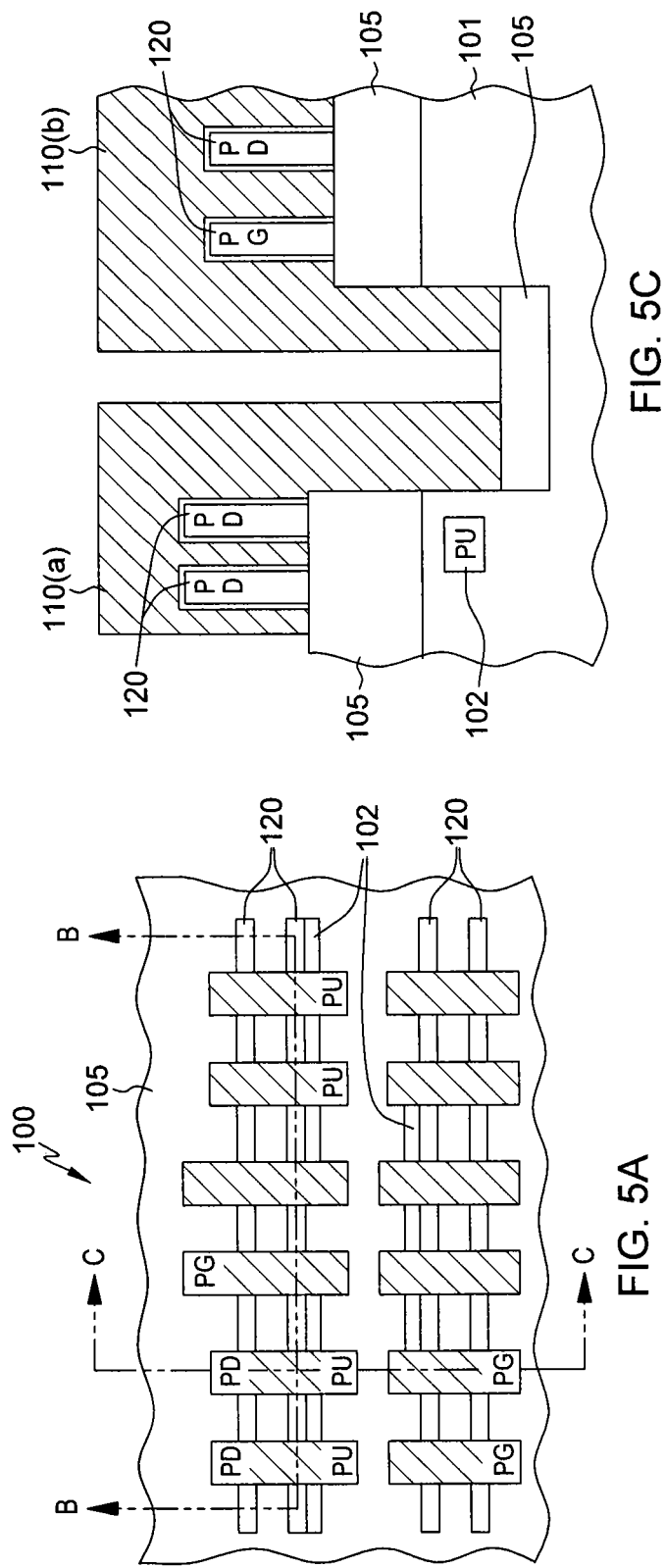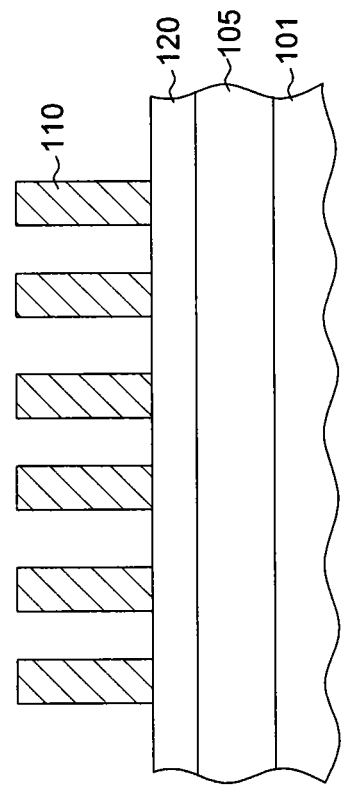
FIG. 5A
FIG. 5B
FIG. 5C

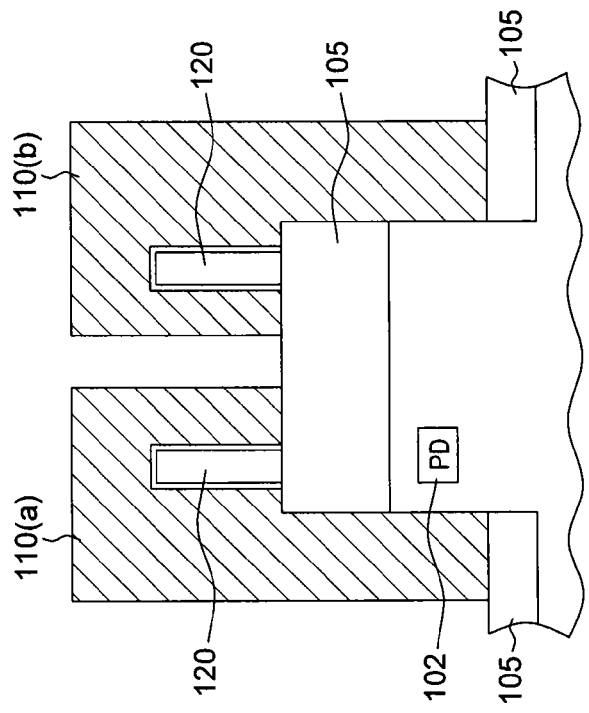
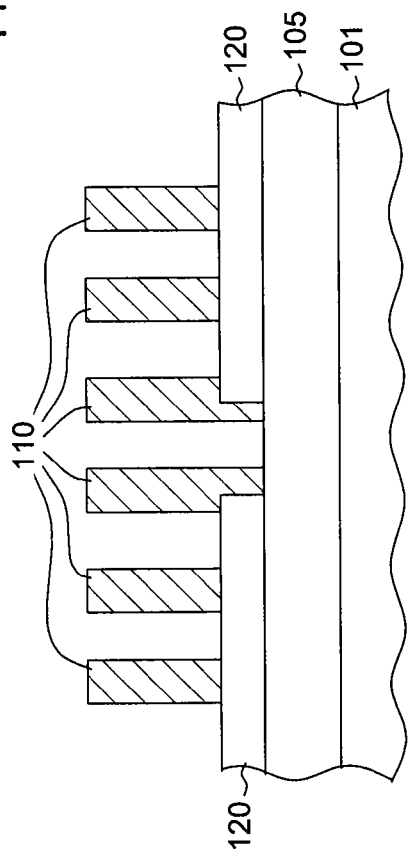
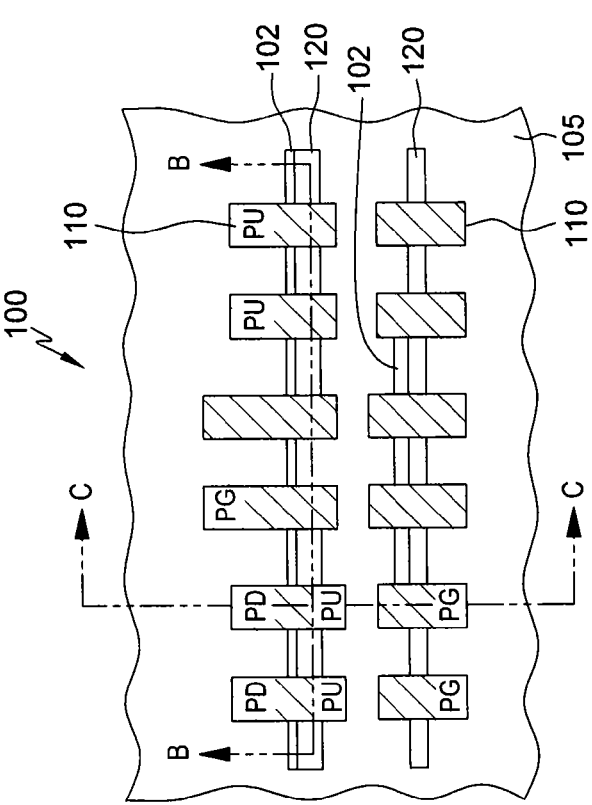
FIG. 6A
FIG. 6B
FIG. 6C

FINFET CIRCUIT STRUCTURES WITH VERTICALLY SPACED TRANSISTORS AND FABRICATION METHODS

FIELD OF THE INVENTION

The present invention relates to semiconductor devices and integrated circuits, and related fabrication methods, and more particularly to circuit structures, such as static random access memory (SRAM) cells, and methods for fabricating circuit structures.

BACKGROUND OF THE INVENTION

Consumer demand continues for increased density integrated circuits, including reduced size processors and logic circuits, and higher capacity memory devices. In an effort to meet such consumer demand, the semiconductor industry continues to pursue advanced technology nodes, in which transistors and other semiconductor devices may be formed with a reduced minimum dimension. Typically, the reduced minimum dimensions refer to the lateral dimensions along the surface of a semiconductor wafer used in the fabrication of the integrated circuits, because two-dimensional semiconductor devices may be conveniently formed using photolithographic patterning and etching steps on the surface of the wafer.

By way of example, a typical SRAM may include six transistors to store a single bit, with the transistors arranged in a particular configuration called an SRAM cell. In addition, an SRAM cell may also include isolation regions to electrically isolate the various transistors. Further, a high density SRAM chip may be formed by repeatedly patterning and forming the SRAM cell design on a wafer, along with affiliated control circuitry. In such a case, the surface area occupied by a single SRAM cell, along with the critical dimensions of the transistors, will determine a limit on the density of the SRAM chip.

Conventionally, two dimensional SRAM cell designs have been used, and as transistor critical dimensions have reduced in advanced technology nodes, the two dimensional designs have been simply scaled down. A need thus exists to further scale down the size of such SRAM cells.

BRIEF SUMMARY

The shortcomings of the prior art are overcome, and additional advantages are provided, through the provision, in one aspect, of a circuit structure. The circuit structure includes: a first transistor, the first transistor having a fin with a first channel region disposed above the substrate and an isolation region; and a second transistor, the second transistor having a second channel region, the second channel region being vertically spaced apart therefrom by the isolation region thereof. The second transistor, and second channel region may be laterally adjacent to the first channel region of the first transistor.

In another aspect, an inverter is presented. The inverter includes: a p-type transistor, the p-type transistor having a fin with a first channel region disposed above an isolation region, the first channel region and the isolation region being disposed above a substrate; an n-type transistor, the n-type transistor having a second channel region, the second channel region being laterally adjacent to the first channel region of the p-type transistor and vertically spaced apart therefrom by the isolation region thereof, where the substrate includes the second channel region of the n-type transistor and the first and second channel regions being vertically spaced apart facilitates inhibition of a leakage current of the inverter; and a gate structure, the gate structure being conformally disposed over and in electrical contact with the first channel region and the second channel region.

In a further aspect, a method for fabricating a circuit structure is presented. The method includes: providing a first transistor having a fin above a substrate and above a substrate, and providing a second transistor, the providing including providing a second channel region of the second transistor within the substrate vertically spaced apart therefrom by the isolation region thereto and laterally adjacent to the first channel region of the first transistor.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 1A is a plan view of a circuit structure, in accordance with one or more aspects of the present invention;

FIG. 1B is a cross-sectional elevational view of the structure of FIG. 1A, taken along line B-B thereof, in accordance with one or more aspects of the present invention;

FIG. 1C is a cross sectional elevational view of the structure of FIG. 1, taken along line C-C, thereof, in accordance with one or more aspects of the present invention;

FIG. 2A is a plan view of another circuit structure, in accordance with one or more aspects of the present invention;

FIG. 2B is a cross-sectional elevational view of the structure of FIG. 2A, taken along line B-B thereof, in accordance with one or more aspects of the present invention;

FIG. 2C is a cross-sectional elevational view of the structure of FIG. 2A, taken along line C-C thereof, in accordance with one or more aspects of the present invention;

FIG. 3A is a plan view of another circuit structure, in accordance with one or more aspects of the present invention;

FIG. 3B is a cross-sectional elevational view of the structure of FIG. 3A, taken along line B-B thereof, in accordance with one or more aspects of the present invention;

FIG. 3C is a cross-sectional elevational view of the structure of FIG. 3A, taken along line C-C thereof, in accordance with one or more aspects of the present invention;

FIG. 4A is a plan view of another circuit structure, in accordance with one or more aspects of the present invention;

FIG. 4B is a cross-sectional elevational view of the structure of FIG. 4A, taken along line B-B thereof, in accordance with one or more aspects of the present invention;

FIG. 4C is a cross-sectional elevational view of the structure of FIG. 4A, taken along line C-C thereof, in accordance with one or more aspects of the present invention;

FIG. 5A is a plan view of another circuit structure, in accordance with one or more aspects of the present invention;

FIG. 5B is a cross-sectional elevational view of the structure of FIG. 5A, taken along line B-B thereof, in accordance with one or more aspects of the present invention;

FIG. 5C is a cross-sectional elevational view of the structure of FIG. 5A, taken along line C-C thereof, in accordance with one or more aspects of the present invention.

FIG. 6A is a plan view of another circuit structure, in accordance with one or more aspects of the present invention;

FIG. 6B is a cross-sectional elevational view of the structure of FIG. 6A, taken along line B-B thereof, in accordance with one or more aspects of the present invention;

FIG. 6C is a cross-sectional elevational view of the structure of FIG. 6A, taken along line C-C thereof, in accordance with one or more aspects of the present invention;

DETAILED DESCRIPTION

Figure 7A:
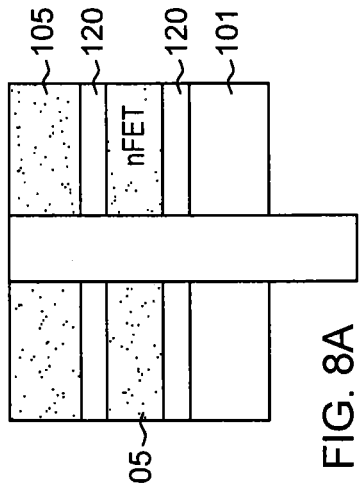
FIG. 7A is a schematic plan view of another circuit structure, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure provides, in part, three-dimensional circuit structures, such as vertically spaced apart transistors, and related fabrication techniques, for use in, for example, logic or memory circuits. For instance, an SRAM cell includes numerous transistors, such as a six transistor (6T) SRAM cell including fin type field effect transistors ("FINFETs"). In an effort to meet consumer demand for increased density, the transistors may be moved closer together, so that each cell occupies a smaller surface area of a wafer. However, such close spacing could lead to, for example, unacceptable leakage currents, which can increase power consumption and generate unacceptable levels of heat. Therefore, isolation regions are disposed laterally between transistors to prevent such disadvantages. But, as noted above, the lateral surface area of isolation regions adds to the area occupied by each SRAM cell.

Advantageously, the present disclosure overcomes limitations of the prior art by allowing for circuit structures with multiple transistors which may be spaced laterally adjacent. For instance, a complementary metal oxide semiconductor (CMOS) inverter circuit may include two adjacent transistors connected by a common gate structure. In such a case, the active regions of the adjacent transistors may be isolated from one another by being laterally spaced apart, with an isolation material or region disposed in between. In one advantage, the present disclosure allows for the active regions to be laterally adjacent, but vertically spaced apart to achieve isolation. A transistor which is laterally adjacent another transistor generally is, for example, located in a different location when viewed from a plan view of the footprint of the SRAM cell such as FIG. 1A. A transistor which is vertically spaced apart from another transistor is located in different vertical plane when viewed from cross sectional view of the SRAM cell, such as, for example, in FIG. 2B and FIG. 2C. Similar concepts may be applied for any circuit structures that include transistors, such as SRAM cells, logic circuits, memory circuits, analog circuits, etc.

Generally stated, provided herein, in one aspect, is a circuit structure with FINFETs. The circuit structure may include, for example: a first transistor, the first transistor having a fin with a first channel region disposed above an isolation region; and a second transistor, the second transistor sharing a gate common with the first transistor having a second channel region, the second channel region being laterally adjacent to the first channel region of the first transistor and vertically spaced apart from said first channel region by the isolation region thereof.

In one embodiment, the fin and the isolation region of the first transistor are disposed above a substrate, and the substrate includes the second channel region of the second transistor. In another embodiment, the first transistor includes a fin structure extending from the substrate, and an upper portion of the fin structure includes the first channel region and a lower portion of the fin structure includes the isolation region.

In one implementation, the structure further includes a gate over and in contact with the fin and over and in electrical contact with the first channel region and the second channel region. In such a case, the gate structure may include a first work function material disposed over the first channel region of the first transistor and a second work function material disposed over the second channel region of the second transistor.

By way of example, the first transistor (a FINFET) may be a p-type transistor and the second transistor may be an n-type transistor. In another example, the circuit structure may be or include an inverter, where the first and second channel regions being vertically spaced apart facilitates inhibition of a leakage current of the inverter. In a further example, the circuit structure may be or include a memory, for example a random access memory or a static random access memory, where the first and second channel regions being vertically spaced apart facilitates inhibition of a leakage current of the memory.

In another aspect, an inverter is presented. The inverter may include, for example: a p-type transistor, the p-type transistor having a FINFET including a fin with a first channel region disposed above an isolation region, the first channel region and the isolation region being disposed above a substrate; an n-type transistor, the n-type transistor having a second channel region, the second channel region being laterally adjacent to the first channel region of the p-type transistor and vertically spaced apart therefrom by the isolation region thereof, where the substrate includes the second channel region of the n-type transistor and the first and second channel regions being vertically spaced apart facilitates inhibition of a leakage current of the inverter; and a gate structure, the gate structure being conformally disposed over and in electrical contact with the first channel region and the second channel region. The first transistor or the second transistor may comprise a FINFET.

In one embodiment, the p-type transistor includes a fin extending from the substrate (e.g. extending above the substrate in three-dimensions), and an upper portion of the fin includes the first channel region and a lower portion of the fin structure includes the isolation region. In another embodiment, the gate structure includes a first work function material disposed over the first channel region of the p-type transistor and a second work function material disposed over the second channel region of the n-type transistor.

In another aspect, a method for fabricating a circuit structure is presented. The method may include: providing a first transistor on the Si portion of an SOI substrate, the providing including disposing a fin (having a first channel region) of the first transistor above the substrate (i.e., the BOX) and above an isolation region; and providing a second transistor , the providing including providing a second channel region of the channel region of the second transistor on the substrate (below BOX) and laterally adjacent to the first fin of the first transistor and vertically spaced apart therefrom by the isolation region, for example, a BOX isolation region thereof.

In one embodiment, the method further includes forming a gate structure including, for example, gate dielectric, work-function layers, and conductive electrode layer, over and in contact with the fin of the first transistor and the second channel region of the second transistor. In such a case, the method may also further include planarizing the gate structure by, for example, CMP, to facilitate formation of laterally coplanar metal layers above the circuit structure.

In one implementation, forming the gate structure includes depositing a first work function material over the fin of the first transistor and a second work function material over the second channel region of the second transistor. In another implementation, forming the gate structure includes depositing the second work function material over the first channel region of the fin and the second channel region of the second transistor; removing the second work function material from over the fin of the first transistor; and depositing the second work function material over the fin of the first transistor and the second channel region of the second transistor.

In one example, providing the first transistor includes providing a FINFET as a p-type transistor and providing the second transistor includes providing the second transistor as an n-type transistor. In another example, fabricating the circuit structure includes fabricating an inverter, where the fin of the FINFET and second channel regions being vertically spaced apart by, for example, BOX, facilitates inhibition of a leakage current of the inverter. In another example, fabricating the circuit structure includes fabricating a static random access memory, where the first and second channel regions being vertically spaced apart facilitates inhibition of a leakage current of the static random access memory.

Reference is made below to the drawings, which are not drawn to scale for ease of understanding, wherein the same reference numbers used throughout different figures designate the same or similar components.

FIG. 1A is a plan view of a structure 100, in accordance with one or more aspects of the present invention. In the embodiment of FIG. 1A, structure 100 represents a portion of an SRAM chip which includes numerous repeating 6T SRAM cells including FINFETs.

For instance, in one or more embodiments, structure 100 includes a substrate 101 and various regions 102 which may include active regions of transistors. In the plan view of FIG. 1A, regions 102 are shown to occupy lateral areas of structure 100. As will be described below, the footprints of regions 102 may include three-dimensional circuit structures, and may include the active regions of transistors, including source regions, drain regions, and channel regions. The regions 102 may be made of different materials, for example, the first and third region 102 may be the Si region (high) on the buried oxide (BOX) 105 of the SOI structure and the second or middle region 102 may be a bulk (low) region, as shown in FIG. 1A. The fins of the FINFET's 120 are laterally adjacent active regions 102 (and their footprint shown in FIG. 1A), and vertically spaced therefrom as shown in FIG. 1C.

In the embodiment of FIG. 1A, gate structures 110 extend over regions 102 (i.e. channel of transistor) in such a way as to perform the function of MOS transistors, and the gate structures may include a gate dielectric disposed below a gate conductor.

By way of explanation, a gate structure will overlap a channel region of a transistor, and if a gate structure overlaps two different channel regions, that will constitute an electrical connection between the transistors sharing the common gate. In addition, two adjacent FINFET transistors 120, and transistor 102 may share a source/drain, also constituting an electrical connection between the transistors. In such a manner, for example, six transistors may be formed and interconnected to form a 6T SRAM cell.

In one or more embodiments, substrate 101 may be a bulk semiconductor material such as a bulk silicon wafer. In another embodiment, substrate 101 may include silicon (Si), single crystal Si, polycrystalline Si, amorphous Si,. In a further embodiment, the substrate can be n-type or p-type doped. In such a case, the substrate may be doped, or various regions may be n-type and p-type doped to form various n-wells and p-wells. In one particular example, the substrate can have a thickness of larger than or equal to 0.1 micrometers.

FIG. 1B is a cross-sectional elevational view of structure 100, taken along line B-B thereof, in accordance with one or more aspects of the present invention. In the embodiment of FIG. 1B, several gate structures 110 are shown, along with an isolation layer 105, which may be a buried oxide (BOX) or any suitable material for electrically isolating transistors. Substrate 101 is also shown.

FIG. 1C is a cross-sectional elevational view of structure 100, taken along line C-C thereof, in accordance with one or more aspects of the present invention. In the embodiment of FIG. 1C, three transistors are depicted, including two adjacent transistors on the left hand side FINFET 120 (a) and transistor 102(c) which are laterally adjacent and vertically spaced apart.

In one or more embodiments, fin 120 with patterns are disposed above isolation layer 105 (BOX) by using SOI substrate. For example, fin 120 may include a channel region of a transistor above BOX. In addition, substrate 101 includes channel regions 102 below BOX, such as channel region 102(c), of a transistor.

By way of explanation, fin 120 on the left side of FIG. 1C is vertically spaced apart from channel region 102(c) of substrate 101 by isolation layer 105, for example, BOX. Advantageously, making use of a three-dimensional circuit structure allows for isolation between the transistors without using lateral spacing, allowing for a reduction in density of such a circuit structure. In one example, the transistor with a channel region within fin 120(a) on the left hand side of FIG. 1C may be a p-type transistor, and the transistor with channel region 102(c) may be an n-type transistor. In another example, the conductivity types of the two transistors may be reversed, i.e., n-type and p-type, respectively. In such an example, the two transistors described may be a complementary metal oxide semiconductor (CMOS) inverter circuit. In one example, the transistor on the left with fin 102(a) may be a FINFET SOI transistor, while transistor 102(c) to the right may be a planar transistor on bulk substrate.

One having skill in the art will readily understand that FINFET and CMOS circuit structures include n-type and p-type transistors interconnected in such a way as to reduce the energy consumption of such circuit structures when compared to circuits having only n-type or only p-type transistors. Indeed, such technologies may be used not only for inverter circuits and SRAM cells, but also for logic, processors, analog, and mixed-signal applications. Advantageously, the techniques described herein will allow for closely spacing such transistors by making use of three-dimension circuit structures, e.g., structures in which one of two adjacent transistors one of which is a FINFET has active region(s), such as a channel region, located at a vertically spaced apart level as compared to the other, allowing for electrical isolation without sacrificing two-dimensional space.

The fin type transistor, Si 120 would be etched to form tall structures extending from a lower level of the substrate. In such a case, one of two adjacent transistors may be formed with an active region near or at the top of a fin (i.e. Si 120), and the other transistor may be formed with an active region at the lower level 102 of the substrate. In such a case, even without lateral spacing for isolation, the BOX isolation layer 105 can provide sufficient electrical isolation. For example, the fin-type FET may be formed above and along the edge of BOX and the planar FET may be formed below along the edge of BOX on the bulk substrate (though not shown in FIG. 1C for simplicity). As shown in FIGS. 1A-1C, the structure may be a SRAM structure with nFET, pull down transistor and pass gate transistor, on SOI, topography high, and pFET, pull-up transistor, on bulk region, topography low.

In the embodiment of FIGS. 1A-1C, a gate structure 110(a) and 110(b) (including gate dielectric, work function and metal electrode layers) may be disposed over both n-type and p-type transistor regions 120(a), 120(b) (dielectric layer shown for illustration) and 120(c) (not shown for simplicity), and an isolation material in between 110(a) and 110(b) (not shown) may be disposed over p-type regions only.

For example, work-function materials may be or include metals and their nitrides, such as titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN). In another example, work-function materials may be or include metals and their carbides, such as titanium carbide (TiC), titanium aluminum carbide (TiAlC), titanium aluminide (TiAl) tantalum carbide (TaC), tantalum aluminum carbide (TaAlC), niobium carbide (NbC), vanadium carbide (VC), etc. In another example, work-function materials may also include ruthenium (Ru), platinum (Pt), molybdenum (Mo), cobalt (Co) and alloys and combinations thereof.

In one example, after disposing isolation material, first work function layer may be selectively etched to remove portions not protected by masking and etch method. Also, a second work function material may also be deposited. In such a manner, the work function material for gate structures above p-type and n-type transistors may be different as known to those skilled in field.

FIGS. 2A-2C describe another circuit structure, in accordance with one or more aspects of the present invention. In the embodiments of FIGS. 2A-2C, structure includes a substrate 101 and various transistors with active regions 102 on bulk substrate. In the plan view of FIG. 2A, fins 120 and active regions 102 are shown to occupy lateral areas of the structure. As will be described below, the footprints of fins 120 and regions 102 may include three-dimensional circuit structures, and may include the active regions of transistors, including source regions, drain regions, and channel regions. The regions 102 may be made of different materials, for example, the first and third region 120 may be bulk (low) regions and the second or middle region 102 may be a SOI (high) region, as shown in FIG. 2A. The structure may also include an isolation BOX layer 105. With reference to FIG. 2C, FINFET transistors 120 with a channel region therein may be disposed laterally adjacent to a transistor 102 with a channel region, and vertically disposed therebelow. As shown in FIGS. 2A-2C, the structure may be, for example, a SRAM structure with pFET, pull-down and pass gate transistor, on SOI, topography high, and nFET, pull up transistor and pass gate transistor on bulk. Note that the PD transistor in FIG. 2C has 2 fins of 120(a) as compared with the single-fin transistor 120(a) in FIG. 1C.

FIG. 3A-3C describe another circuit structure, in accordance with one or more aspects of the present invention. In the embodiments of FIGS. 3A-3C, structure includes a substrate 101 and various transistors with active regions 102. In the plan view of FIG. 3A, fins 120 and regions 102 are shown to occupy lateral areas of the structure. As will be described below, the footprints of fins 120 and regions 102 may include three-dimensional circuit structures, and may include the active regions of transistors, including source regions, drain regions, and channel regions. The regions 102 may be made of different materials, for example, the first and third region 102 may be bulk (low) regions and the middle region 120 may be a SOI (high) region, as shown in FIG. 3A. The structure may also include an isolation layer 105. With reference to FIG. 3C, FINFET transistors 120 with a channel region therein may be disposed laterally adjacent to transistors 102 with a channel region, and vertically disposed therebelow. As shown in FIGS. 3A-3C, the structure may be, for example, a SRAM structure with pFET, pull-down and pass gate transistor, on SOI, topography high, and nFET, pull up transistor and pass gate transistor on bulk.

FIG. 4A-4C, describe another circuit structure, in accordance with one or more aspects of the present invention. In the embodiments of FIGS. 4A-4C, structure includes a substrate 101 and various transistors with active regions 102 on bulk. In the plan view of FIG. 4A, fins 120 and regions 102 are shown to occupy lateral areas of the structure. As will be described below, the footprints of fins 120 and regions 102 may include three-dimensional circuit structures, and may include the active regions of transistors, including source regions, drain regions, and channel regions. The regions 102 may be made of different materials, for example, the first and third region 120 may be SOI (high) regions and the middle region 102 may be a bulk (low) region, as shown in FIG. 4C. The structure may also include an isolation layer 105. With reference to FIG. 4C, FINFET transistors 120 with a channel region therein may be disposed laterally adjacent to a transistor 102 with a channel region, and vertically disposed therebelow (i.e. 120 fins on top of 102 active region). As shown in FIGS. 4A-4C, the structure may be, for example, a SRAM structure with pFET, pull-down and pass gate transistor, on SOI, topography high, and nFET, pull up transistor and pass gate transistor on bulk.

FIG. 5A-5C, describe another circuit structure, in accordance with one or more aspects of the present invention. In the embodiments of FIGS. 5A-5C, structure includes a substrate 101 and various transistors with active regions 102. In the plan view of FIG. 5A, fins 120 and regions 102 are shown to occupy lateral areas of the structure. As will be described below, the footprints of fins 120 and regions 102 may include three-dimensional circuit structures, and may include the active regions of transistors, including source regions, drain regions, and channel regions. The regions 102 may be made of different materials, for example, the first and third region 120 may be SOI (high) regions and the middle region 102 may be a bulk (low) region, as shown in FIG. 5C. The structure may also include an isolation layer 105. With reference to FIG. 5C, FINFET transistors 120 with a channel region therein may be disposed laterally adjacent to a transistor 102 with a channel region, and vertically disposed therebelow. As shown in FIGS. 5A-5C, the structure may be, for example, a SRAM structure with pFET, pull-down and pass gate transistor, on SOI, topography high, and nFET, pull up transistor and pass gate transistor on bulk.

FIG. 6A-6C, describe another circuit structure, in accordance with one or more aspects of the present invention. In the embodiments of FIGS. 6A-6C, structure includes a substrate 101 and various transistors with active regions 102. In the plan view of FIG. 6A, fins 120 and active regions 102 are shown to occupy lateral areas of the structure. As will be described below, the footprints of fins 120 and regions 102 may include three-dimensional circuit structures, and may include the active regions of transistors, including source regions, drain regions, and channel regions. The regions 102 may be made of different materials, for example, the first and third region 120 may be SOI (high) regions and the middle region 102 may be a bulk (low) region, as shown in FIG. 6C The structure may also include an isolation layer 105. With reference to FIG. 2C, FINFET transistors 120 with a channel region therein may be disposed laterally adjacent to a transistor 102 with a channel region, and vertically disposed therebelow. As shown in FIGS. 6A-6C, the structure may be, for example, a SRAM structure with pFET, pull-down and pass gate transistor, on SOI, topography high, and nFET, pull up transistor and pass gate transistor on bulk.

Figure 7B:
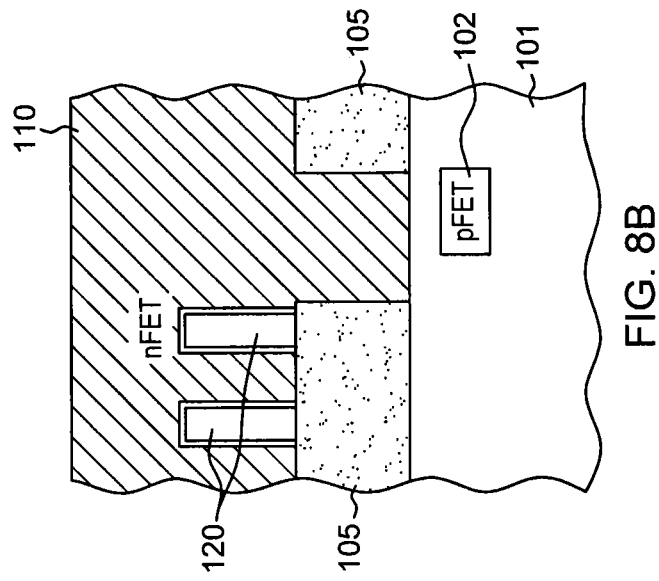
FIG. 7B is a cross-sectional elevational view of a structure similar to that shown in FIG. 7A, taken through the gate in accordance with one or more aspects of the present invention.

Referring to FIGS. 7A and 7B, a circuit structure in accordance with the present invention is shown depicting an inverter-type circuit. Similar to the prior descriptions herein, FINFET transistor 120 is vertically spaced from transistor 102 laterally adjacent thereto. In this particular embodiment, FINFET 120 is an nFET while transistor 102 is the pFET.

Figure 8A:
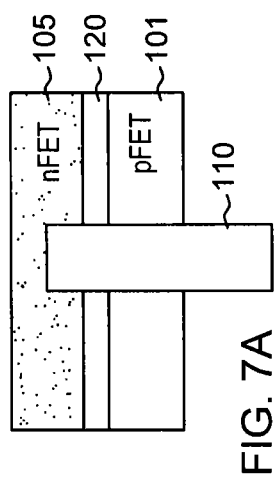
FIG. 8A is a schematic plan view of another circuit structure, in accordance with one or more aspects of the present invention.
Figure 8B:
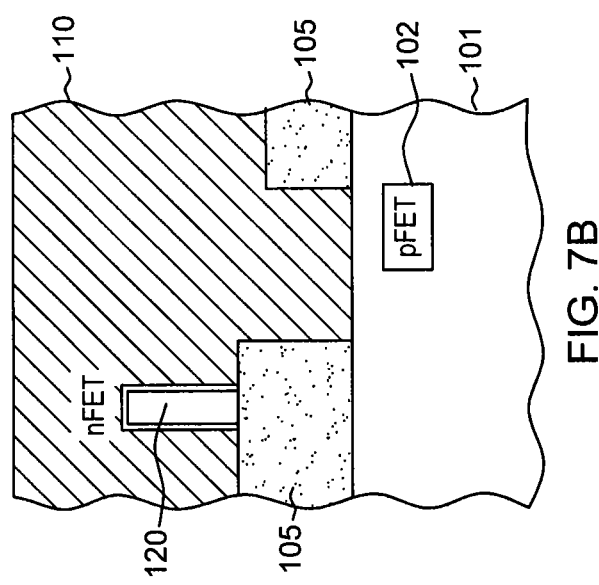
FIG. 8B is a cross-sectional elevational view of a structure similar to that shown in FIG. 8A, taken through the gate, in accordance with one or more aspects of the present invention.

Similarly referring to FIGS. 8A and 8B, an inverter circuit is also shown. Here there are two-fin nFET transistors 120 laterally spaced to one another. pFET transistor 102 is vertically spaced from the nFET transistors and laterally adjacent at least one fin of the nFET transistor. In FIGS. 7A-8B, isolation material 105, as previously described herein with respect to other embodiments, vertically isolates laterally spaced transistors.

Figure 9A:
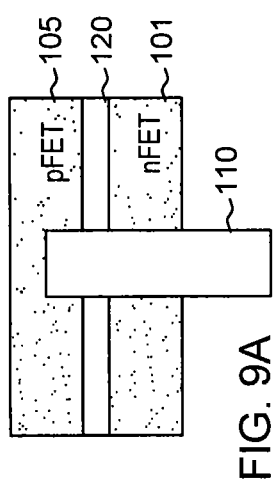
FIG. 9A is a schematic plan view of another circuit structure, in accordance with one or more aspects of the present invention.
Figure 9B:
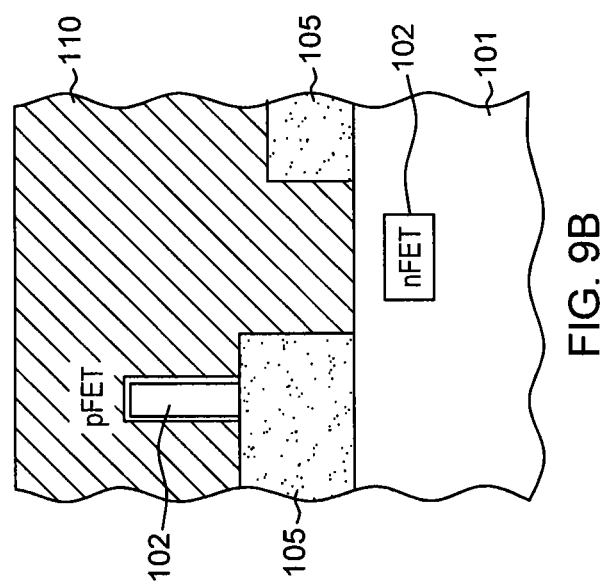
FIG. 9B is a cross-sectional elevational view of a structure similar to that shown in FIG. 9A, taken through the gate, in accordance with one or more aspects of the present invention.

Referring now to FIGS. 9A and 9B, an additional inverter circuit is shown. The inverter circuit is similar to the circuit shown in the embodiments of FIGS. 7A and 7B, however, the nFET and pFET transistors are reversed. Specifically, in FIGS. 9A and 9B, the FINFET transistor 120 is a pFET while the adjacent non-FINFET transistor is an nFET transistor 102 on bulk.

Figure 10A:
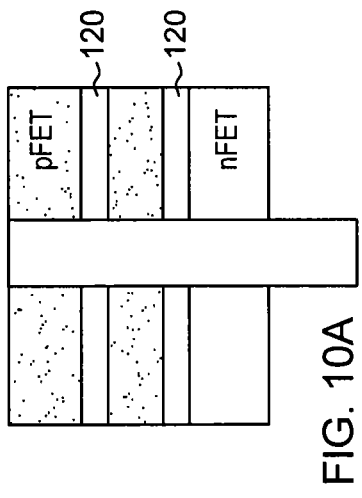
FIG. 10A is a schematic plan view of another circuit structure, in accordance with one or more aspects of the present invention.
Figure 10B:
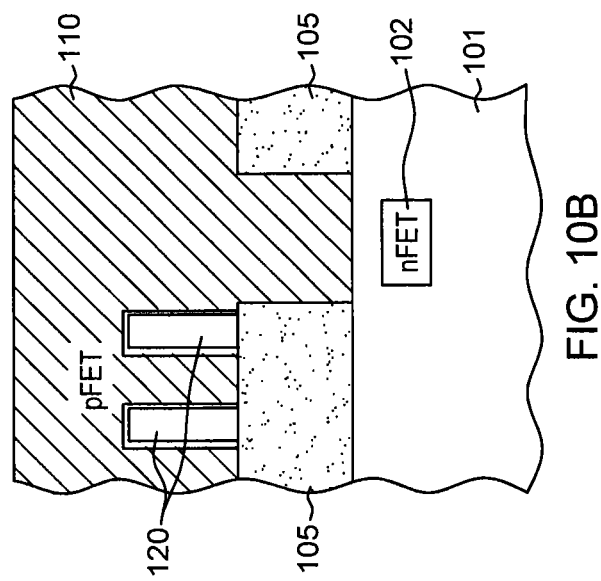
FIG. 10B is a cross-sectional elevational view of a structure similar to that shown in FIG. 10A, taken through the gate, in accordance with one or more aspects of the present invention.

Similarly, in FIGS. 10A and 10B, represent an inverter circuit similar to the inverter circuit in FIGS. 8A and 8B, where the nFET and pFET transistors are reversed. Specifically, in FIGS. 10A and 10B, the FINFET transistors 120 are 2-fin pFETs while the other transistor 102 is the nFET transistor on bulk.

By way of explanation, under certain circumstances, it may be desirable to use halo implants to provide isolation by implanting impurities, such as n-type or p-type dopants, within portions of the circuit structure, such as a channel region underlying the gate structure, or the various layers described. Such tuning may be achieved by plasma doping or ion implantation of the circuit structure using various materials.

By way of summary, those skilled in the art will note from the above description that there is a need for enhanced circuit structures, for example, SRAM cells having zero lateral spacing between pull up (PU) and pull down (PD), e.g., using semiconductor on insulator (SOI) technologies. By way of explanation, scaling of SRAM cells is an important factor in each successive technology node, and SOI technology is widely used in low power application, such as computing and communications systems, smartphones, etc., due to low parasitic capacitance, high device performance, and low power. Described herein, at least in part, is a new SRAM cell and integration scheme which is highly compatible with SOI process flow and may significantly reduce the SRAM footprint and increase SRAM density.

Advantageously, a 30% reduction in footprint may be achieved by layouts as described herein. In one embodiment, a p-type field effect transistor (p-FET) PU may be formed on a semiconductor such as silicon above a buried oxide (BOX), and n-type field effect transistors (n-FET) pull up (PU) and pass gate (PG) may be formed on a substrate located vertically below the level of the BOX, e.g., by removing the BOX from n-FET areas (using etching).

In all the drawings, pull up, pass gate and pull down transistors are designated using PU, PG, and PD, respectively. In some embodiments, n-FET PD and PG may be formed on a semiconductor above the BOX, and a p-FET PU may be formed on the substrate below the level of the BOX, by removing the BOX from p-FET areas.

In a further example, the PU and PD/PG transistors may be electrically and physically isolated by the BOX itself, eliminating the need for any lateral spacing at all (e.g., using shallow trench isolation), and the BOX isolation may serve to isolate the transistors. For example, a BOX with a thickness of greater than 3 nanometers may by capable of isolating or blocking Vcc of roughly 1 volt or 1.1 volt at a 20nanometer node.

In one or more embodiments, a self-aligned chamfering process may be used to provide different work function metal gate layers for n-type and p-type transistors. For example, by providing a first work function layer over both regions, protecting the first work function layer in, say, the n-type regions, etching, and forming a second function layer, the first work function layer will contact the n-type regions and the second work function layer will contact the p-type regions. For example, the addition of a second work function metal layer above the first work function metal layer in the n-type regions may not influence electrical properties such as threshold voltages of the transistors because only the first directly contacting layer over the gate dielectric may influence such properties.

Other embodiments include patterning a sacrificial gate structure in a replacement gate process, in which the gate structures are at different vertical levels by first depositing a sacrificial gate (e.g., polysilicon) at a certain thickness (e.g., 100 nm) and then planarizing. Next, hard mask layers may be deposited at certain thickness (e.g., 10 nm). Next, multilayer patterning layers (e.g., spin on carbon, organic planarizing layer, photoresist) may be deposited, exposure/developing may be performed, followed by hard mask etching, photoresist removal, and polysilicon vertical etch, stopping on silicon. In other examples, transistor halo implants and sources/drains may be formed, followed by replacement metal gate processing.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    fabricating a circuit structure, the fabricating comprising:
        providing a first transistor above a substrate, the providing comprising disposing a fin having a first channel region of the first transistor above the substrate above an isolation region, wherein the fin is entirely above a top surface of the isolation region;
        providing a second transistor, the providing comprising providing a second channel region of the second transistor within, and surrounded by, the substrate, the second channel region being entirely lower than a bottom surface of the isolation region and laterally adjacent to the first channel region of the first transistor and vertically spaced apart therefrom by a thickness of the isolation region thereof; and
        forming a first gate conformally over and in electrical contact with the fin of the first transistor and over the second channel region of the second transistor.

2. The method of claim 1, further comprising forming a second gate over a third channel region of a third transistor, the third transistor comprising a second fin, adjacent the second transistor, having the third channel region of the third transistor above the substrate above a second isolation region, wherein the second fin is entirely above a top surface of the second isolation region.

3. The method of claim 2, further comprising planarizing the first and second gates to facilitate formation of laterally coplanar metal layers above the circuit structure.

4. The method of claim 2, wherein forming the first gate comprises depositing a first work function material over the first channel region of the first transistor and depositing a second work function material over the second channel region of the second transistor.

5. The method of claim 1, wherein providing the first transistor comprises providing the first transistor as a p-type transistor and providing the second transistor comprises providing the second transistor as an n-type transistor.

6. The method of claim 1, wherein fabricating the circuit structure comprises fabricating an inverter, wherein the first and second channel regions being vertically spaced apart facilitates inhibition of a leakage current of the inverter.

7. The of method claim 1, wherein fabricating the circuit structure comprises fabricating a static random access memory, wherein the first and second channel regions being vertically spaced apart facilitates inhibition of a leakage current of the static random access memory.

* * * * *